United States Patent
Thompson et al.

(10) Patent No.: US 9,716,012 B2
(45) Date of Patent: Jul. 25, 2017

(54) METHODS OF SELECTIVE LAYER DEPOSITION

(71) Applicant: Applied Materials, Inc., Santa Clara, CA (US)

(72) Inventors: David Thompson, San Jose, CA (US); Huixiong Dai, San Jose, CA (US); Patrick M. Martin, Capitola, CA (US); Timothy Michaelson, Milpitas, CA (US); Kadthala R. Narendrnath, San Jose, CA (US); Robert Jan Visser, Menlo Park, CA (US); Jingjing Xu, Cupertino, CA (US); Lin Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/560,525

(22) Filed: Dec. 4, 2014

(65) Prior Publication Data

US 2015/0162214 A1 Jun. 11, 2015

Related U.S. Application Data

(60) Provisional application No. 61/913,852, filed on Dec. 9, 2013.

(51) Int. Cl.
*H01L 21/3205* (2006.01)
*C23C 16/04* (2006.01)
(Continued)

(52) U.S. Cl.
CPC ........ *H01L 21/32051* (2013.01); *C23C 16/04* (2013.01); *C23C 16/18* (2013.01);
(Continued)

(58) Field of Classification Search
None
See application file for complete search history.

(56) References Cited

U.S. PATENT DOCUMENTS

| 4,579,621 A | 4/1986 | Hine |
| 5,186,718 A | 2/1993 | Tepman et al. |

(Continued)

FOREIGN PATENT DOCUMENTS

KR 10-2004-0005315 4/2005

OTHER PUBLICATIONS

PCT International Search Report and Written Opinion in PCT/US2014/068755, mailed Feb. 27, 2015, 11 pages.
(Continued)

*Primary Examiner* — Shamim Ahmed
*Assistant Examiner* — Bradford Gates
(74) *Attorney, Agent, or Firm* — Servilla Whitney LLC

(57) ABSTRACT

Provided are methods for selective deposition. Certain methods describe providing a first substrate surface; providing a second substrate surface; depositing a first layer of film over the first and second substrate surfaces, wherein the deposition has an incubation delay over the second substrate surface such that the first layer of film over the first substrate surface is thicker than the first layer of film deposited over the second substrate surface; and etching the first layer of film over the first and second substrate surfaces, wherein the first layer of film over the second substrate surface is at least substantially removed, but the first layer of film over the first substrate is only partially removed.

18 Claims, 9 Drawing Sheets

(51) Int. Cl.
  *C23C 16/18* (2006.01)
  *C23C 16/455* (2006.01)
  *H01L 21/285* (2006.01)
  *H01L 21/768* (2006.01)

(52) U.S. Cl.
  CPC .. *C23C 16/45551* (2013.01); *C23C 16/45553* (2013.01); *H01L 21/28562* (2013.01); *H01L 21/76849* (2013.01)

(56) References Cited

U.S. PATENT DOCUMENTS

| | | | |
|---|---|---|---|
| 6,002,176 | A | 12/1999 | Nguyen et al. |
| 7,807,523 | B2 | 10/2010 | Liu et al. |
| 8,058,179 | B1* | 11/2011 | Draeger ............ H01L 21/02164 156/345.26 |
| 8,278,216 | B1* | 10/2012 | Alers ................ H01L 21/28556 257/E21.171 |
| 2002/0027261 | A1 | 3/2002 | Besser et al. |
| 2002/0142587 | A1 | 10/2002 | Allen et al. |
| 2010/0015798 | A1* | 1/2010 | Suzuki .................... C23C 16/02 438/653 |
| 2012/0178253 | A1* | 7/2012 | Ahn ...................... C23C 16/401 438/643 |
| 2013/0193108 | A1 | 8/2013 | Zheng et al. |
| 2014/0273492 | A1* | 9/2014 | Anthis .............. H01L 21/32135 438/720 |

OTHER PUBLICATIONS

Agarwel, Andur, et al., Plasma atomic layer etching using conventional plasma equipment, *J. Vac. Sci. Technol. A 27(1)* Jan./Feb. 2009, 37-50.

Athavale, Satish D., et al., Realization of atomic layer etching of silicon, *J. Vac. Sci. Technol. B 14(6)* Nov./Dec. 1996, 3702-3705.

Sacconi, L., et al., Metal Complexes of N,N,N',N'-Tetramethyldiamines. I. Nickel (II) and Cobalt(II) Complexes, *Inorganic Chemistry vol. 6, No. 2* Feb. 1967, 262-267.

Yang, Ki-Yeon, et al., Selective deposition of the silver nano-particles using patterned the hydrophobic self-assembled monolayer patterns and zero-residual nano-imprint lithography, *Microelectronic Engineering 84* 2007, 1552-1555.

PCT International Report on Patentability in PCT/US2014/068755 mailed Jun. 23, 2016, 8 pages.

* cited by examiner

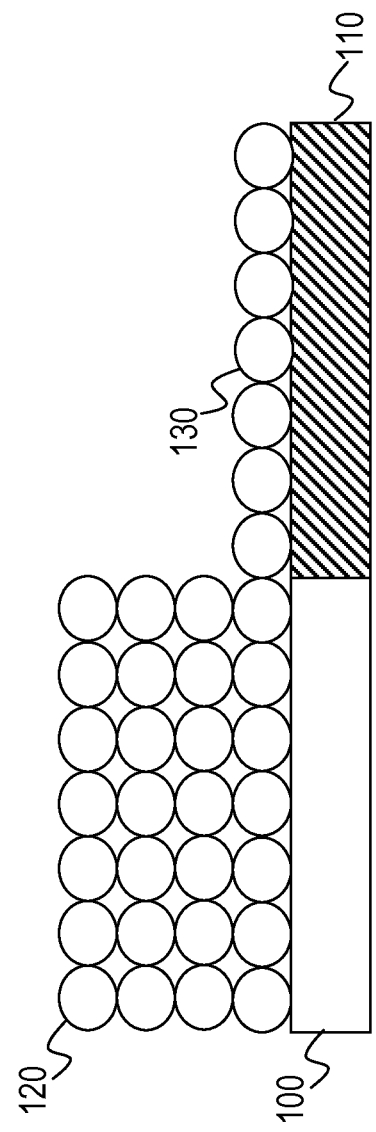

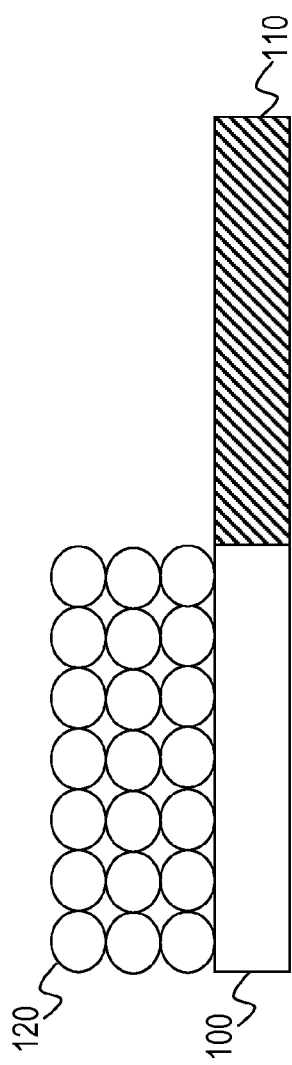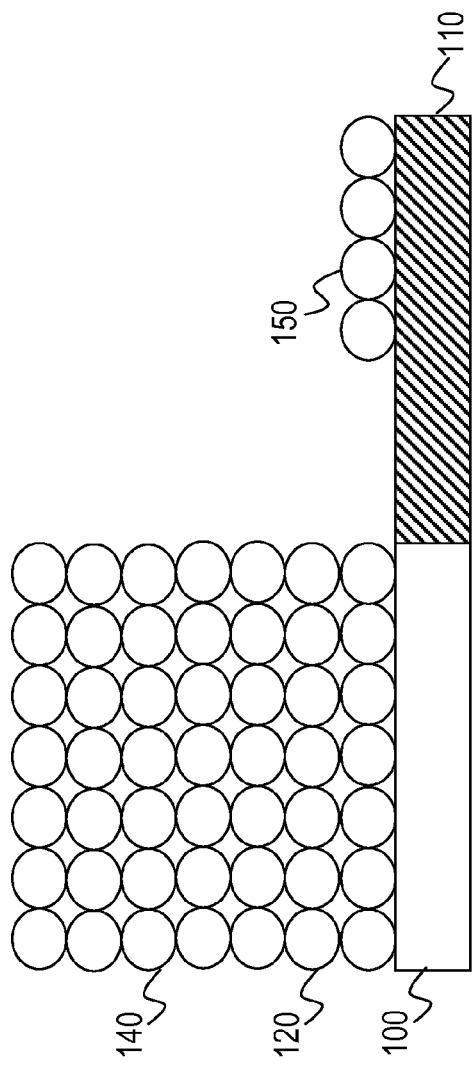

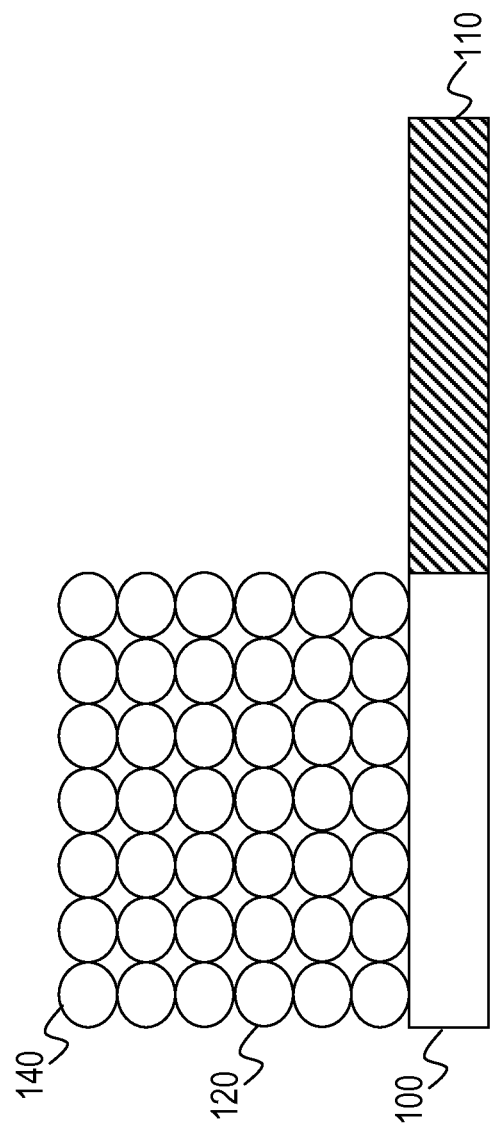

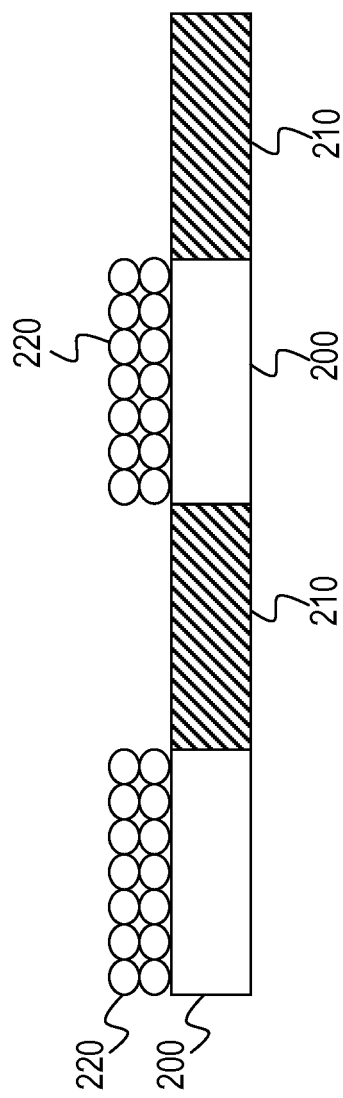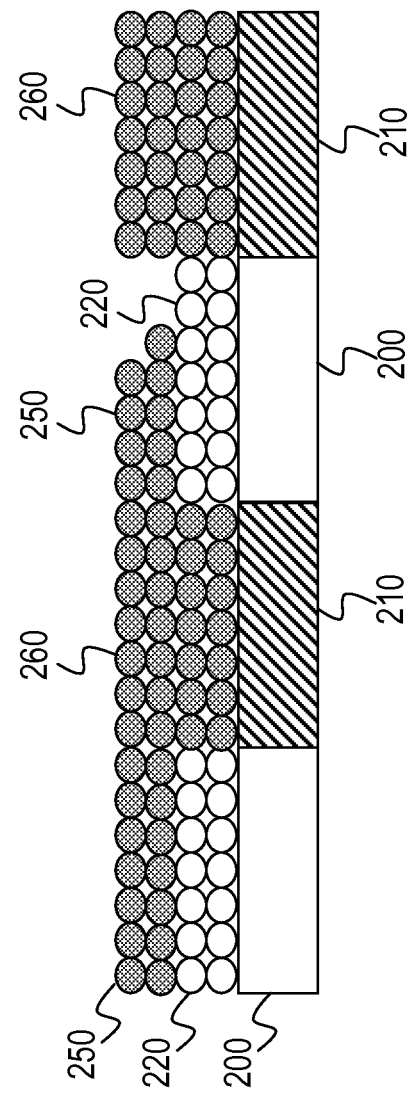

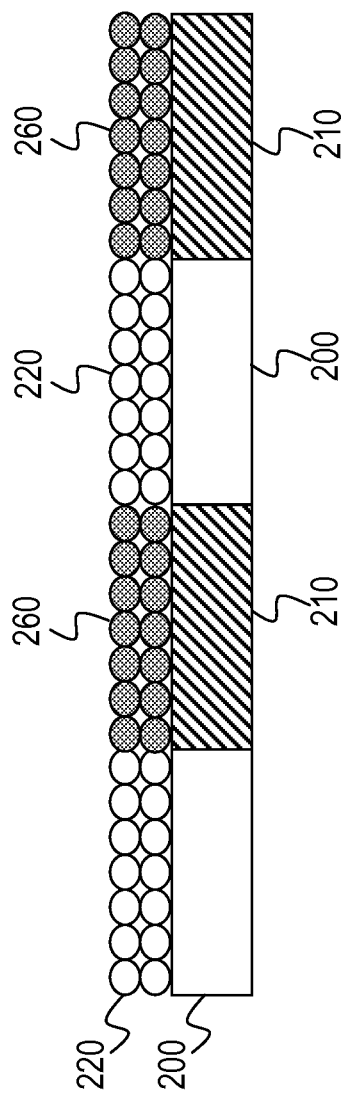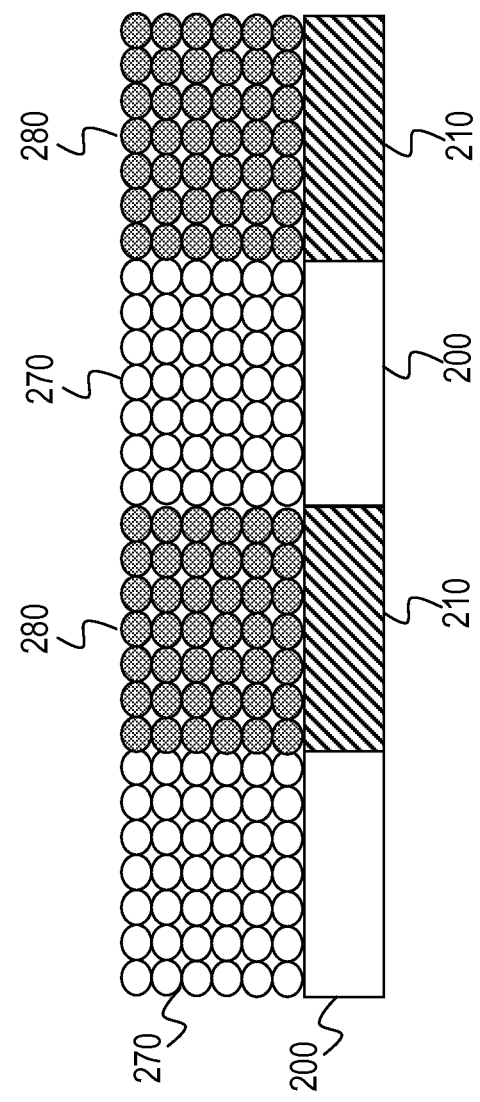

METHODS OF SELECTIVE LAYER DEPOSITION

CROSS-REFERENCE TO RELATED APPLICATIONS

This application claims priority to U.S. Provisional Application No. 61/913,852, filed Dec. 9, 2013, the entire disclosure of which is hereby incorporated herein.

TECHNICAL FIELD

Aspects of the present disclosure generally relate to film deposition suitable for semiconductor applications. In particular, aspects of the disclosure relate to selective deposition.

BACKGROUND

Deposition of films on a substrate surface is an important process in a variety of industries including semiconductor processing, diffusion barrier coatings and dielectrics for magnetic read/write heads. Chemical vapor deposition (CVD) and atomic layer deposition (ALD) are two deposition processes used to form or deposit various materials on a substrate. In general, CVD and ALD processes involve the delivery of gaseous reactants to the substrate surface where a chemical reaction takes place under temperature and pressure conditions favorable to the thermodynamics of the reaction However, there lies a great challenge where deposition is desired only in certain areas of a substrate surface. Typically, such a result is achieved by depositing a continuous film and patterning it using subsequent lithography and etch steps. Such processing is time consuming and expensive, and does not offer the precision required for many applications. One possible solution is the use of selective deposition whereby the material is deposited only in the desired areas thereby eliminating the need for subsequent patterning steps. Existing methods for selective deposition, however, generally suffer from high levels of defects. These defects can take the form of deposition in undesired areas (i.e., the process is not truly selective), and/or the absence of deposition in desired areas. Many processes cannot tolerate these types of defects. Furthermore, a selective deposition process requires a certain throughput and selective growth rate to be commercially viable. That is, a commercially viable process would require relatively rapid processing steps, as well as rapid environmental changes between individual processing steps. Yet another concern is that there is often a certain level of orthogonality required in a selectively deposited feature. Mushrooming into adjacent features may interfere with later processing steps and/or the performance of the semiconductor device.

One example of a commercially useful process is selective epitaxy. In selective epitaxy, a semiconductor is grown selectively on a semiconductor substrate relative to an insulator substrate. Selective epitaxy is achieved by using both a deposition gas and an etch gas in the same process at the same time. It exploits the fact that nucleation occurs more readily on the crystalline substrate than on the insulator, as well as differences in the etch rate of material deposited on the semiconductor versus the insulator. However, this process is limited to epitaxial processes.

There is thus a need for methods for selectively forming films over only certain parts of substrate surfaces without one or more of the problems discussed above.

SUMMARY

One aspect of the disclosure pertains to a method of selective layer deposition. In one or more embodiments, the method comprises providing a substrate comprising a first substrate surface and a second substrate surface. The method may also further comprise depositing a first layer of film over the first and second substrate surfaces, wherein the deposition has an incubation delay over the second substrate surface such that the first layer of film over the first substrate surface is thicker than the first layer of film deposited over the second substrate surface. In some embodiments, the method further comprises etching the first layer of film over the first and second substrate surfaces, wherein the first layer of film over the second substrate surface is at least substantially removed, but the first layer of film over the first substrate is only partially removed.

Another aspect of the disclosure also pertains to a method of selective atomic layer deposition. In one or more embodiments, the method comprises providing a first substrate surface and providing a second substrate surface. The method may then further comprise selectively depositing a first layer of film over the first and second substrate surfaces to provide a first layer of film over the first substrate surface having a greater thickness than a first layer of film over the second substrate surface. In some embodiments, the method then comprises etching the first layer of film over the first and second substrate surfaces, wherein the first layer of film over the second substrate surface is at least substantially removed, but the first layer of film over the first substrate is only partially removed.

A third aspect of the disclosure pertains to a method of selective atomic layer deposition of cobalt. In some embodiments, the method comprises providing a first substrate surface comprising cobalt and providing a second substrate surface comprising a dielectric. In one or more embodiments, the method further comprises exposing the first and second substrate surface to a precursor comprising Co(TMSA)$_2$(THF) to provide a first layer consisting essentially of cobalt over the first and second substrate surfaces, wherein the first layer consisting essentially of cobalt has a greater thickness over the first substrate than the second substrate. In some embodiments, the method further comprises exposing the first layer consisting essentially of cobalt over the first and second substrate surfaces to a compound having a structure represented by formula (I):

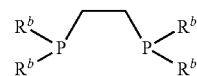

wherein each R$^b$ is independently hydrogen, R or C1-C4 alkyl.

A fourth aspect of the disclosure pertains to a method of processing a substrate. In one or more embodiments, the method comprises laterally moving a substrate having a first and second substrate surface beneath a gas distribution plate comprising a plurality of elongate gas ports including a first gas outlet to deliver a first reactive gas, a second gas outlet to deliver a second reactive gas, a third gas outlet to deliver a third reactive gas. The method may further comprise delivering the first reactive gas to the first and second substrate surfaces to form a first reactive layer on the first and second substrate surfaces. In some embodiments, the method further comprises purging any unreacted first reactive gas. In one or more embodiments, the method further comprises delivering the second reactive gas to the first and second substrate surfaces to react with the first reactive layer to form a first layer of film over the first and second substrate surfaces, wherein the deposition has an incubation delay over the second substrate surface such that the first layer of film over the first substrate surface is thicker than the first layer of film deposited over the second substrate surface. The method may further comprise again purging any unreacted second reactive gas. In some embodiments, the method further comprises delivering the third reactive gas to the first and second substrate surfaces to etch the first layer of film over the first and second substrate surfaces, wherein the first layer of film over the second substrate surface is at least substantially removed, but the first layer of film over the first substrate is only partially removed. The method may further comprise then purging any unreacted third reactive gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A-E show a selective deposition process in accordance with one or more embodiments of the disclosure;

FIG. 2A-F show a selective deposition process in accordance with one or more embodiments of the disclosure;

DETAILED DESCRIPTION

Figure 2A:
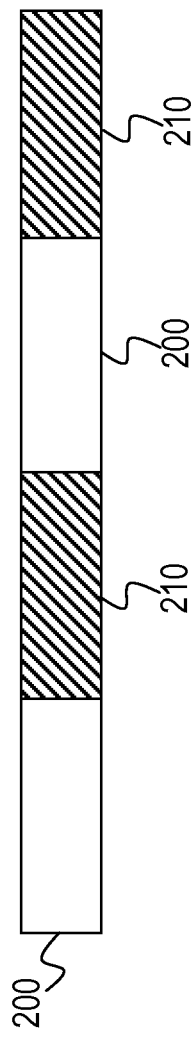

Before describing several exemplary embodiments of the disclosure, it is to be understood that the disclosure is not limited to the details of construction or process steps set forth in the following description. The disclosure is capable of other embodiments and of being practiced or being carried out in various ways. It is also to be understood that the complexes and ligands of the present disclosure may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

It has been discovered that incubation delays or preferential deposition on certain substrates may be utilized to selectively deposit layers of films on substrates. Films are deposited at relatively small thicknesses, which prevent the excessive buildup on surfaces where film deposition is not desired. The selectively deposited material may be used in the final product, or later replaced with a different material. Additionally, by spatially separating deposition and etch processes, many different chemistries can be used, while maintaining high throughput and precision.

Accordingly, one aspect of the disclosure pertains to a method of selective layer deposition. In one or more embodiments, the method comprises providing a substrate comprising a first substrate surface and a second substrate surface. A first layer of film may be deposited over the first and second substrate surfaces, wherein the deposition has an incubation delay over the second substrate surface such that the first layer of film over the first substrate surface is thicker than the first layer of film deposited over the second substrate surface. Then, the first layer of film over the first and second substrate surfaces may be etched, wherein the first layer of film over the second substrate surface is at least substantially removed, but the first layer of film over the first substrate is only partially removed.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are desired, as well as the particular chemistry used. In one or more embodiments, the first substrate surface will comprise a metal, and the second substrate surface will comprise a dielectric, or vice versa. In some embodiments, a substrate surface may comprise certain functionality (e.g., —OH, —NH, etc.).

Likewise, the films that can be used in the methods described herein are quite varied. In some embodiments, the films may comprise, or consist essentially of a metal. Examples of metal films include, but are not limited to, cobalt (Co), copper (Cu), tungsten (W), etc. In some embodiments, the film comprises a dielectric. Examples include, $SiO_2$, SiN, $HfO_2$, etc.

The term "substantially removed" as used herein, refers to complete or near complete removal of a film. In one or more embodiments, this refers to the remaining film having a thickness of less than about 10, 8, 6, 4, 3, 2 or 1 Angstroms. In alternative embodiments, at least about 50, 60, 70, 80, 85, 90, 95, 96, 97, 98, 98 or 100% of a given film is removed. In some embodiments, the film is completely removed.

Several processes will be exemplified below and in the figures. It is to be understood that the structures shown are representative of the chemical mechanisms that are thought to be occurring during one or more of the processes described herein. However, they are not intended to be limiting.

An exemplary selective deposition process is shown in FIGS. 1A-E. Starting with FIG. 1A, a first substrate surface 100 and a second substrate surface 110 are provided. Moving on to FIG. 1B, deposition is carried out over the first and second substrate surfaces. The deposition may be any discussed herein, including atomic layer deposition, chemical vapor deposition, physical vapor deposition, etc. Deposition chemistries are chosen such that there is a deposition delay over the second substrate surface 110, or some other process whereby deposition occurs preferentially over the first substrate surface 100. The process results in a first layer of film 120 deposited over the first substrate surface 100, and a first layer of film 130 deposited over the second substrate surface 110. Because of the preferential deposition onto the first substrate surface 100, the first layer of film 120 deposited over the substrate surface 100 is thicker than the first layer of film 130 deposited over the second substrate surface 110. It should also be noted that the first layer of film 130 over deposited over the second substrate surface 110 is shown as continuous, but in fact may not be continuous. That is, there may only be patches (or "nucleations") of film deposition on the non-preferred substrate surface, rather than a continuous layer. Further, the first layer of film 130 deposited over the second substrate 110 may have varying thickness, as shown in FIG. 1B.

Next, an etch process may be carried out. Any suitable etch process may be utilized, including atomic layer etching, or conventional etch processes. In some embodiments, the etch process will remove a given thickness of film. Therefore, a thickness equivalent to that deposited over the non-preferred substrate surface may be etched, leaving little or no film left on the non-substrate surface. In turn, only a portion is removed from the preferred substrate surface. Turning to FIG. 1C, an etch is carried out, leaving no film over the second substrate surface 110, but still leaving part of the first layer of film deposited over the substrate surface 120. The effect is a net growth of film over the first substrate surface 100 with none over the second substrate surface 110.

The entire process may be repeated. FIG. 1D shows another deposition process carried out. A second layer 140 of film is deposited over the first layer of film 120 over the first substrate surface. A second layer 150 of film is also deposited directly over the second substrate surface 110. Again, because the film deposits preferentially onto the first substrate surface 100, the film will be thicker over the first substrate surface than on the second substrate surface. The etch process may then be repeated, as shown in FIG. 1E. The film deposited over the second substrate surface is substantially removed, leaving little or no film. Part of the second layer of film 140 is also removed in the etch process, though a substantial amount is left. The net result is now part of the first layer of film 120 and second layer of film 140 is left over the first substrate surface, while the second substrate surface 110 is left essentially bare. The process may be repeated until the net thickness of film over the first substrate surface is achieved.

Figure 2B:
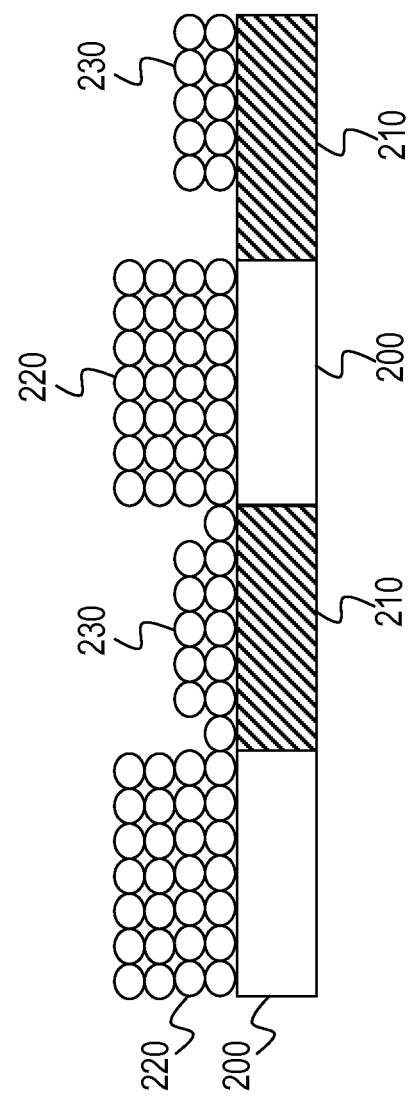

In some embodiments, additional selective deposition processes may be carried out on the second substrate surface. FIGS. 2A-F show an example of such an embodiment. In FIG. 2A, two areas of a first substrate surface 200 are provided with intervening areas of a second substrate surface 210. In FIG. 2B, a first layer of film is deposited. The film has an incubation delay over the second substrate surface 210, but not over the first substrate surface 200. This results in faster deposition anywhere the preferred substrate surface (first substrate surface 200) is present, and therefore in a first layer of a first film 220 deposited over the first substrate surface 200 that is thicker than a first layer of a first film 230 deposited over the second substrate surface 210. As discussed above, the first layer of a first film 230 deposited over the second substrate surface 210 may be uniformly thick or may not be continuously deposited onto the substrate surface. Moving onto FIG. 2C, an etch process may be carried out to remove some of the first layer of film deposited in the previous step. This results in all, or substantially all, of the film over the second substrate surface 210 being removed. In contrast, only part of the first layer of film 220 is removed from areas of the first substrate surface 200. Now, a second film may be deposited over the second substrate surface 210. In such embodiments, there may be an incubation delay over the first substrate surface 200 and/or over the first layer of film 220 over the first substrate surface 200. This leaves behind a first layer of a second film 250 over the first layer of the first film 220 over the first substrate surface. In contrast, there is now just a layer of the second film 260 over anywhere the second substrate surface 210 is exposed. As shown in FIG. 3E, an etch step may be carried out to remove the second film from over the first substrate surface 200. This results in a first layer of the first film 220 over areas of the first substrate surface 200, as well as a first layer of the second film 260 over areas of the second substrate surface 210. This process may be repeated until a desired thickness of the two films is achieved, as shown in FIG. 3F. This figure shows a layer of the first film 270 over the first substrate surface having a desired thickness, as well as a layer of the second film 280 over the second substrate surface 210 also of a desired thickness. As is evident from these figures, one or more embodiments of the disclosure allow for controlled growth over two types of substrate surfaces. Because the films are each grown incrementally, but alternately, a vertical or near vertical interface is maintained between the films. If only one of the films was grown to the desired thickness, then there exists the possibility of "mushrooming" or "bread loafing", wherein the sides of the deposited film are not flush with the respective substrate surface. As used herein, "mushrooming" and/or "bread loafing" refer to undesired horizontal growth of the feature, as opposed to vertical growth.

Film Deposition

One or more embodiments of the disclosure require that the deposition process used has an incubation delay on some substrate surfaces but not others. This allows for rapid growth on preferred substrate surfaces, but delayed or minimal growth on non-preferred substrate surfaces. Notably, this does not require absolute selective growth, and some film growth on the non-preferred substrate surface is acceptable.

Generally, any film deposition process meeting the above requirements may be utilized, including, but not limited to, atomic layer deposition (ALD), chemical vapor deposition (CVD), physical vapor deposition (PVD), plasma enhanced vapor deposition (PEALD), etc.

As used herein, "atomic layer deposition" or "ALD" refers to a process wherein a substrate surface is alternately exposed to precursors and/or reagents (excluding any carrier gases, or other compounds not otherwise involved in deposition). In some embodiments related to ALD, there may be some overlap in exposures, but at least a majority of the exposure length of a given precursor does not overlap with other precursors. In one or more embodiments, the term refers to self-limited deposition of a single layer of atoms onto a surface, as the context indicates.

As used herein, "chemical vapor deposition" or "CVD" refers to a process wherein a substrate surface is exposed to more than one precursor/reagent at a time. In some embodiments related to CVD, there may be some differences in exposure times, but at least a majority of the exposure length involves co-flows of the precursors/reagents.

As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction).

The specific chemistries utilized for deposition will depend on the desired film. In some embodiments, a film comprising, or consisting essentially of, cobalt or tungsten is deposited. Tungsten may be deposited by using a suitable tungsten precursor. The tungsten precursor can be any suitable tungsten-containing gas including, but not limited to, halide based tungsten precursors or a metal-organic based tungsten precursor. For example, in some embodiments, the tungsten precursor may comprise tungsten pentachloride ($WCl_5$), compounds with the empirical formula of $WCl_5$ (e.g., $W_2Cl_{10}$, $W_3Cl_{15}$), tungsten hexachloride ($WCl_6$), compounds with the empirical formula of $WCl_6$ (e.g., $W_2Cl_{12}$), tungsten hexafluoride ($WF_6$). In one or more embodiments, the tungsten-containing precursor is selected from the group consisting of tungsten pentachloride, compounds with the empirical formula $WCl_5$ and tungsten hexachloride. A reducing agent may be used as a co-reagent to produce a film consisting essentially of tungsten.

Similarly, cobalt may be deposited using an organometallic precursor. In some embodiments, the organometallic precursor may include a bis(trialkylsilyl)amido ligand, having a structure represented by:

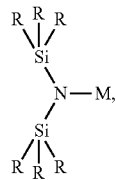

wherein R represents a hydrocarbyl group and M represents a metal (i.e. cobalt). In some embodiments, R is methyl, ethyl or propyl. The organometallic precursor can be used in CVD or ALD procedures. The metal may be coordinated to one or more other ligands. Examples of suitable ligands include, but are not limited to other bis(trialkylsilyl)amido ligands or tetrahydrofuran (THF). Therefore, in some embodiments, an organometallic precursor having a structure represented by formulae (I) or (II) may be used:

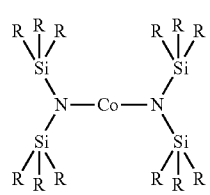

(I)

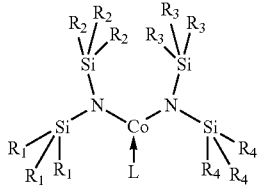

(II)

wherein each R is independently C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics, L is a coordinating ligand comprising a Lewis base.

In some embodiments, the R groups are C1-C4 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. In one or more embodiments, the R groups on a given silicon atom may be the same. Embodiments where all of the R groups on a given ligand are methyl, the ligand is known a bis(trimethylsilyl) amido (TMSA). In further embodiments, all R groups are the same. For example, in one or more embodiments, each R group is methyl.

Another exemplary embodiment of the disclosure, the cobalt precursor has a structure represented by formula (III)

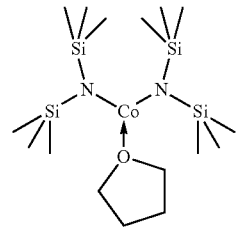

(III)

Deposition using this precursor with $NH_3$ followed by temperatures of about 175-225° C. have been shown to deposit cobalt at a rate of about 1.5 A/cycle. Deposition with this precursor can be selective to metal surfaces. That is, there is an incubation delay over dielectrics.

Figure 3:
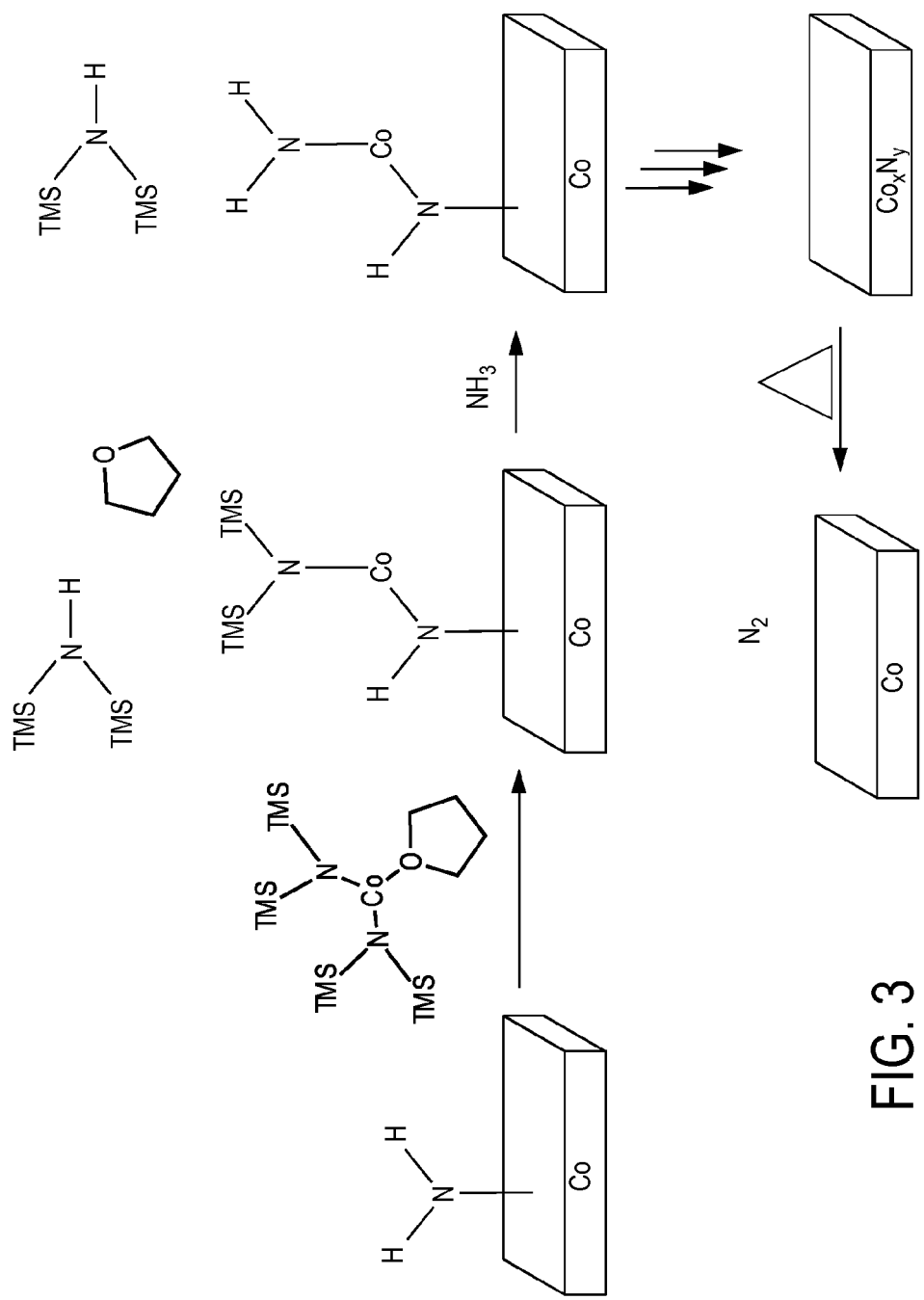
FIG. 3 shows a chemical schematic of a deposition method in accordance with one or more embodiments of the disclosure.

FIG. 3 shows a possible chemical schematic for an exemplary deposition in accordance with one or more embodiments of the disclosure. A bis(trimethylsilyl)amido)(THF)cobalt precursor is flowed to a substrate surface. In some embodiments, the substrate surface may contain reactive functional groups, also known as "reactive handles," which can increase reactivity towards a precursor. For example, in some embodiments, and as shown in FIG. 3, the substrate surface may contain —$NH_2$ functionality. The cobalt atom in the precursor may react with a nitrogen atom on the substrate surface, producing bis(trimethylsilyl) amine and free THF as a byproduct. The bis(trimethylsilyl) amine can be purged or otherwise removed away from the substrate. A co-reactant, in this case ammonia, can then be flowed to the substrate surface. The ammonia can react with the cobalt atom to release the second bis(trimethylsilyl) amido ligand, again producing bis(trimethylsilyl) amine as a byproduct, and leaving behind the bonded cobalt atom in the form of cobalt nitride ($Co_xN_y$). The byproduct may again be purged from the substrate surface. The cobalt nitride left on the substrate surface contains an —$NH_2$ group for reaction during the next cycle. If no additional cycles are desired, the substrate may be treated with heat to remove the nitrogen and leave a film consisting essentially of cobalt.

In some embodiments, the substrate is exposed to a first precursor and a co-reactant. The exposure to the precursor and co-reactant can be substantially simultaneously, as in a CVD reaction, or sequentially, as in an ALD reaction. In embodiments where a film consisting essentially of Co is desired, the co-reactant may comprise a reducing agent. In some embodiments, the reducing agent is selected from the group consisting of alane, $H_2$, $H_2$ plasma and Ar plasma.

The vapor pressure of the precursor should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors and pressure. The properties of the specific substrate and film precursors may be evaluated using methods known in the art, allowing selection of appropriate temperature and pressure for the reaction. In one or more embodiments, the deposition takes place at a temperature of from about 100 to about 400° C., about 150° C. to about 250° C., or about 200° C., from about 100 to about 200° C., or about 200 to about 300° C.

Film Etching

Some embodiments require etch processes to remove film from areas of a substrate where film is not desired. This may be carried out after a deposition cycle is completed. That is, in some embodiments, deposition and etch are not carried out simultaneously, and/or there is no overlap in the two processes. In one or more embodiments, such etch processes are selective for the film being removed. This allows for etch of the film without unintended removal of underlying substrate. The etch may be carried out long enough to remove any film deposited on non-preferred substrate surfaces, although it should be noted that partial removal from preferred substrate surfaces is likely. Any suitable etch methods known in the art may be used, including but not limited to, chemical etch, plasma etch or atomic layer etch. The etch process may be carried out at once (such as in the case of plasma etch), or repeated (as in the case of repeating atomic layer etch cycles) until the desired effect is achieved. In some embodiments, the etch process is selective for the film being removed. That is, the etch process will not also etch the underlying substrate surface. This allows for complete, or near complete, removal of the deposited film without also losing or otherwise altering the substrate surface.

It should be noted that deposition and etch can be carried out in any combination. For example, atomic layer deposition may be paired with plasma etch, chemical vapor deposition may be paired with atomic layer etch, plasma enhanced atomic layer deposition may be paired with chemical etch, etc.

In some embodiments, the etching process comprises an atomic layer etch method. The method may comprise activating a substrate surface comprising at least one transition metal. Activation of the substrate surface comprises exposing the substrate surface to heat, a plasma, an oxidizing environment, or a halide transfer agent to provide an activated substrate surface; and exposing the activated substrate surface to a reagent comprising a Lewis base or pi acid to provide a vapor phase coordination complex comprising one or more atoms of the transition metal coordinated to one or more ligands from the reagent.

In one or more embodiments, the substrate surface comprises at least one transition metal. In one or more embodiments, the transition metal comprises a first row transition metal. In some embodiments, the transition metal is selected from the group consisting of Co, Cu, Ru, Ni, Fe, Pt, Mn and Pd. In some embodiments, the substrate surface consists essentially of the transition metal. In one or more embodiments, the substrate surface may comprise more than one transition metal, including metal alloys. An example of such a substrate includes a substrate comprising both cobalt and iron.

Once the surface has been activated and a reagent gas has been flowed over the reactive surface, it is thought that the reagent gas forms a metal coordination complex with one or more of the transition metal atoms from the substrate surface. Ideally, the reaction conditions are chosen so that the formed coordination complex is volatile at a given temperature (i.e., in the vapor phase). Then, the complex may simply be flowed away from the substrate surface and, as appropriate, out of the chamber. That is, in some embodiments, the method further comprises purging the vapor phase coordination complex.

The substrate surface will therefore be at somewhat thinner than before the etch process. In some embodiments, the etch process is self-limiting. That is, each time an etch cycle is performed, the same amount of the substrate is removed, although not necessarily at the monolayer. For example, a certain number of Angstroms (e.g., about 7), or several monolayers may be removed per cycle. In these embodiments, one or more layers of transition metal atoms may be reliably removed each cycle. Such a method may be referred to as "alternating exposure etching," where the substrate surface is sequentially or substantially sequentially exposed to reagent and activation agents. As used herein "substantially sequentially" means that the majority of the duration of the pulses does not overlap with the pulse of co-reagent, although there may be some overlap. In other embodiments, the process may be self-limiting at the monolayer. That is, in such embodiments, only one layer of transition metal atoms is removed at a time. Such a process may be referred to as "atomic layer etching."

The specific reaction conditions for the etch reactions may be selected based on the properties of the reagents and substrate surface, as well as the pressure used. The etch may be carried out at atmospheric pressure, but may also be carried out at reduced pressure. The substrate temperature should be high enough to keep the formed metal complexes in the gaseous phase and to provide sufficient energy for surface reactions. The properties of the specific substrate, film precursors, etc. may be evaluated using methods known in the art, allowing selection of appropriate temperature and pressure for the reaction.

In some embodiments, the substrate surface temperature during etch is kept below about 500, 475, 450, 425, 400, 375, 350, 325, or 300° C. In embodiments where the etch is utilized for cleaning buildup off of equipment, the substrate temperature may be kept below 250, 225, or 200° C. The substrate surface temperature should be at least about room temperature (23° C.) or at least about 25, 50 or 75° C.

In accordance with one or more embodiments of the disclosure, the reagents comprise a Lewis base or pi acid. A "pi acid," as used herein, refers to a compound that, as a ligand, can accept electron density from a metal into empty pi orbitals as well as donate electron density to the metal via a sigma bond. A "Lewis base," as used herein, refers to a compound that, as a ligand, can donate an electron pair to a metal. There are several suitable reagents for the processes described herein.

In one or more embodiments, the Lewis base or pi acid comprises a chelating amine. In some embodiments, the chelating amine has a structure represented by:

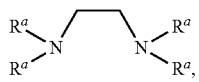

wherein each $R^a$ is independently hydrogen or C1-C4 alkyl group with the proviso that not all of the $R^a$ groups are hydrogen. In further embodiments, the chelating amine is selected from the group consisting of N,N,N',N'-tetramethylethylene diamine (also known as TMEDA), ethylene diamine, N,N'-dimethylethylenediamine, 2-(aminomethyl)pyridine, 2-[(alkylamino)methyl]pyridine, and 2-[dialkylamino)methyl]pyridine, wherein the alkyl group is a C1-C6 alkyl group.

In some embodiments, the Lewis base or pi acid comprises CO, alkylphosphines ($PR^1_3$, wherein each $R^1$ is a C1-C6 alkyl group), 1,2-bis(difluorophosphino)ethane, $N_2O$, NO, $NH_3$, $NR^2_3$, wherein each $R^2$ is independently hydrogen or C1-C6 branched or unbranched, substituted or unsubstituted, alkyl, allyl or cyclic hydrocarbon or heteroatomic group, or a compound having the structure:

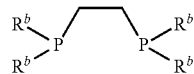

wherein each $R^b$ is independently hydrogen, R or C1-C4 alkyl. It is noted that $N_2O$ is not a traditional Lewis base, but does have a lone electron pair. In some embodiments, wherein the reagent comprises $NR^2_3$, each $R^2$ is independently C1-C6 alkyl. In other embodiments, at least one of the $R^2$ groups is cyclohexylamine.

In one or more embodiments, the pi acid comprises an aluminum precursor. In further embodiments, the aluminum precursor has formula $AlH_nX_mR^c_p$, wherein X is a halogen, the sum of n+m+p is 3, and $R^c$ is C1-C6 alkyl.

In one or more embodiments, the process includes activation of the substrate surface. In some embodiments, activation of the substrate surface provides a surface termination which will react with a Lewis acid and/or pi acid. In further embodiments, the surface termination will react with any one or more of the Lewis acids and/or pi acids.

In some embodiments, activation of the substrate surface is accomplished by heating the substrate surface. Heating the substrate surface can be carried out by methods known in the art, including simply heating the chamber. In some embodiments, the substrate surface temperature is kept below about 400, 375, 350, 325, or 300° C. In embodiments where the etch is utilized for cleaning buildup off of equipment, the substrate temperature may be kept below 250, 225, or 200° C. The substrate surface temperature should be at least about room temperature (23° C.) or at least about 25, 50 or 75° C.

With processes that include heating, a reagent gas may be passed over the heated substrate. The substrate surface may be heated and exposed to the reagent gas simultaneously or substantially simultaneously. As used herein, the phrase "exposure of the substrate surface to heat and the reagent occur substantially simultaneously" means that the substrate surface is heated with a majority of the heating duration overlapping with exposure to the reagent, although they might not be completely co-extensive. In some embodiments, the reagent gas utilized after heating the substrate comprises one or more of CO, $PR^1_3$, $N_2O$, NO, $NH_3$, $NR^2_3$, wherein each $R^1$ is a C1-C6 alkyl group and each $R^2$ is C1-C6 branched or unbranched, substituted or unsubstituted, alkyl, allyl or cyclic hydrocarbon or heteroatomic group. In other embodiments, the reagent gas comprises a chelating amine, such as N,N,N'N'-tetramethylethylene diamine and N,N'-dimethylethylenediamine.

In some embodiments, activation of the substrate surface comprises exposing the substrate surface to a plasma. The substrate surface may be exposed to the plasma and the reagent gas sequentially, substantially sequentially, simultaneously or substantially simultaneously. As used herein, the phrase "exposure of the substrate surface to the plasma and the reagent occur substantially sequentially" means that the substrate surface is exposed to the plasma with a majority of the plasma exposure duration not coinciding with exposure to the reagent, although there may be some overlap. As used herein, the phrase "exposure of the substrate surface to the plasma and the reagent occur substantially simultaneously" means that the substrate surface is exposed to the plasma with a majority of the plasma exposure duration overlapping with exposure to the reagent, although they might not be completely co-extensive.

Generally, a plasma used for activation should enhance the reactivity of the surface toward subsequent reagent exposure steps. In one or more embodiments, the plasma comprises $H_2$, NO, $N_2O$, $NF_3$, $Cl_2$, Ar or $N_2$. In some embodiments, the plasma changes the substrate surface by adding a different surface termination. For example, in embodiments where the substrate surface is exposed to a plasma comprising $N_2O$, the exposure to the plasma is thought result in a —NO surface termination. While not wishing to be bound to any particular theory, it is thought that by adding such functionality, the substrate surface becomes more reactive to certain reagents, particularly one or more of the pi acids and/or Lewis bases described herein.

In some embodiments, exposure to the substrate surface comprises exposing the substrate surface to a halide transfer agent. In one or more embodiments, exposure of the substrate surface to the halide transfer agent and any pi acid and/or Lewis base occurs sequentially or substantially sequentially As used herein, the phrase "exposure of the substrate surface to the halide transfer agent and the reagent occur substantially sequentially" means that the substrate surface is exposed to the halide transfer agent with a majority of the halide transfer agent exposure duration not coinciding with exposure to the reagent, although there may be some overlap. In some embodiments, exposure of the substrate surface to the halide transfer agent and any pi acid and/or Lewis base occurs simultaneously or substantially simultaneously. As used herein, "substantially simultaneously" means that the substrate surface is exposed to the halide transfer agent with a majority of the halide transfer agent exposure duration coinciding with exposure to the reagent, although there may be some time where the two do not overlap. Again, while not wishing to be bound to any particular theory, it is thought that exposure of the substrate surface to a halide transfer agent results in the substrate surface having halide surface terminations, thereby making it more reactive to one or more of the pi acids and/or Lewis bases described herein. In some embodiments, the halide transfer agent comprises a dihalide. In further embodiments, the dihalide comprises $I_2$, $Br_2$, $Cl_2$. In other embodiments, the halide transfer agent comprises a trialkylsilyl halide or an alkyl halide, wherein the alkyl group(s) of either the trialkylsilyl halide or alkyl halide may be a C1-C6 alkyl group. Examples of suitable alkyl halides include ethyliodide and diiodoethane.

In some embodiments, activation of the substrate surface comprises exposing the substrate surface to an oxidizing environment. In one or more embodiments, exposure of the substrate surface to the halide transfer agent and any pi acid and/or Lewis base occurs sequentially or substantially sequentially. As used herein, the phrase "exposure of the substrate surface to the oxidizing environment and the reagent occur substantially sequentially" means that the substrate surface is exposed to the oxidizing environment with a majority of the oxidizing environment exposure duration not coinciding with exposure to the reagent, although there may be some overlap. In one or more embodiments, exposure to an oxidizing environment comprises exposing the substrate surface to $O_2$, $O_3$, $N_2O$, $NO$, $Br_2$, $F_2$, $I_2$ or $Cl_2$.

In some embodiments, the reagent gas utilized after exposing the substrate to an oxidizing environment comprises one or more of $CO$, $PR^1_3$, $N_2O$, $NO$, $NH_3$, $NR^2_3$, wherein each $R^1$ is a C1-C6 alkyl group and each $R^2$ is C1-C6 branched or unbranched, substituted or unsubstituted, alkyl, allyl or cyclic hydrocarbon or heteroatomic group. In other embodiments, the reagent gas comprises a chelating amine, such as N,N,N'N'-tetramethylethylene diamine and N,N'-dimethylethylenediamine. In other embodiments, the reagent gas utilized after exposing the substrate to an oxidizing surface comprises an aluminum-containing precursor, such as chloroalkylaluminums, aluminum trihalides, aluminum halide hydrides, alkyl aluminum hydride.

It should be noted that any of the above activation processes and/or reagents may be combined. That is, more than one activation process may be utilized, or more than one reagent may be used during a given etch sequence. Furthermore, it is to be understood that the process may be repeated until the desired amount of transition metal has been etched away.

Figure 4:
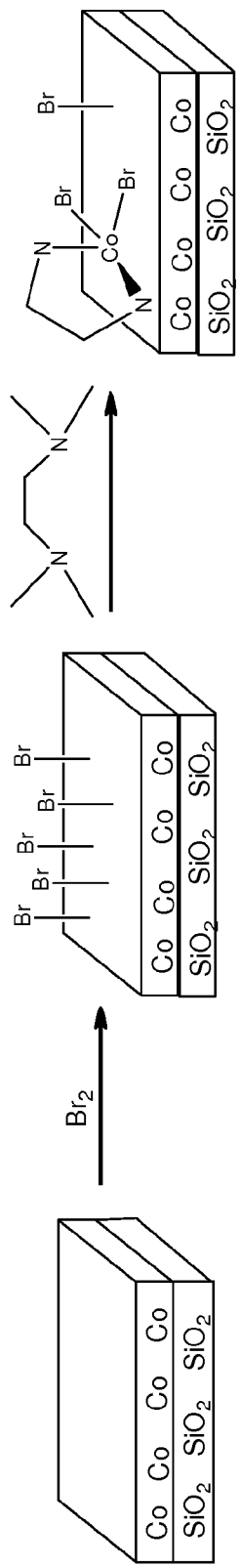
FIG. 4 shows a chemical schematic of an etch process in accordance with one or more embodiments of the disclosure.

FIG. 4 illustrates an exemplary etch process in accordance with one or more embodiments of the disclosure. Specifically, a thermal etching process using halide activation. First, a cobalt substrate surface overlying a silicon oxide substrate surface is provided. The cobalt substrate surface is exposed to a halide transfer agent, in this case shown as $Br_2$. An exemplary process may utilize $Br_2$ at a substrate temperature of above about 200° C. Once the substrate surface is exposed to the halide transfer agent, the surface is modified with halide termination/surface functionality to provide an activated substrate surface. Next, activated substrate surface is exposed to a Lewis base and/or pi acid. FIG. 4 is shown with N,N,N',N'-tetramethylethylenediamine (TMEDA). Once the activated substrate surface is exposed to the reagent, the reagent complexes a metal atom from the substrate surface. As shown in the process, where TMEDA is utilized as the reagent, it may complex a cobalt atom, resulting in a metal coordination complex with the cobalt coordinated to the N,N,N',N'-tetramethylethylenediamine and two halide ligands. The formed cobalt complex may then be purged away from the substrate surface, taking away at least one cobalt atom from the original substrate surface. Embodiments pertaining to the use of TMEDA in an etch process have been shown to etch approximately 7 A/cycle, and is selective to silicon dioxide ($SiO_2$), tantalum nitride ($Ta_3N_5$) and silicon nitride (SiN), meaning that these materials will not be etched.

Other Processing Conditions and Equipment

In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during some of the processes disclosed herein, it should be noted that plasmas may not required.

One or more of the processes described herein include a purge. The purging process keeps the reagents separate. The substrate and chamber may be exposed to a purge step after stopping the flow of one or more of the reagents. A purge gas may be administered into the processing chamber with a flow rate within a range from about 10 sccm to about 10,000 sccm, for example, from about 50 sccm to about 5,000 sccm, and in a specific example, about 1000 sccm. The purge step removes any excess precursor, byproducts and other contaminants within the processing chamber. The purge step may be conducted for a time period within a range from about 0.1 seconds to about 60 seconds, for example, from about 1 second to about 10 seconds, and in a specific example, from about 5 seconds. The carrier gas, the purge gas, the deposition gas, or other process gas may contain nitrogen, hydrogen, argon, neon, helium, or combinations thereof. In one example, the carrier gas comprises argon and nitrogen.

According to one or more embodiments, the substrate is subjected to processing prior to and/or after the methods described herein. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), other etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the chamber to prevent reactants from moving from the chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

In atomic layer deposition-type chambers, the substrate can be exposed to the reagents and/or other compounds either spatially or temporally separated processes. Temporal ALD (or etch) is a traditional process in which the first precursor flows into the chamber to react with the surface. The first precursor is purged from the chamber before flowing the second precursor.

In spatial ALD (or etch), both the first and second precursors are simultaneously flowed to the chamber but are separated spatially so that there is a region between the flows that prevents mixing of the precursors. In spatial ALD (or etch), the substrate must be moved relative to the gas distribution plate, or vice-versa. In one or more embodiments, spatial deposition allows for relatively rapid switching in chemical environments, which in turn allows for increased throughput. Spatially separating precursors and/or reagents allows for using chemistries that are otherwise not compatible with each other (i.e., will react undesirably with each other). With temporal separation, a chamber must be completely purged to remove unreacted precursors and/or reagents. However, in practice, it is not possible to completely remove all of precursor and/or reagent, and some may be left over. When the next precursor and/or reagent is then flowed in, there may be unintended cross-reaction of the two precursors/reagents. In contrast, with spatial separation, it is the substrate that is moved through purge gas curtains from one chemical environment to another, resulting in the amelioration of unintended cross-reactions. Furthermore, by merely moving the substrate from one chemical environment to another, much time is saved that is usually associated with having to purge a chamber prior to introduction of other precursors/reagents.

In one or more embodiments, the deposition and etching processes described herein may take place in one chamber, particularly for spatial applications. One or more of the methods described herein require many different precursors/reagents or other chemicals to accomplish the deposition and etch processes. For example, if two reagents are used for deposition and two for etch, then there are potentially six chemical reactions that need to be managed. With an increasing number of chemical, there is an increase in the chemical interactions that need to be managed. As spatial separation prevents cross-reactions, it can be particularly suitable for the methods described herein.

In one or more embodiments, the deposition and/or etch process occur in a single chamber. Such embodiments can pertain to spatially separated processes. In further embodiments, the substrate surfaces may move laterally under one or more gas distribution plate comprising a plurality of elongate gas ports. The elongate gas ports may include one or more gas outlets for each of the reagents utilized to deposit and etch the films in the selective deposition processes described herein. For example, if a deposition process requires two precursors/reagents and an etch process requires only one, then the gas distribution plate can comprise a plurality of elongate gas ports including a first gas outlet to deliver a first reactive gas, a second gas outlet to deliver a second reactive gas, a third gas outlet to deliver a third reactive gas. The process can then comprise laterally moving a substrate having a first and second substrate surface beneath the gas distribution plate, delivering the first reactive gas to the first and second substrate surfaces to form a first reactive layer on the first and second substrate surfaces; purging any unreacted first reactive gas; delivering the second reactive gas to the first and second substrate surfaces to react with the first reactive layer to form a first layer of film over the first and second substrate surfaces, wherein the deposition has an incubation delay over the second substrate surface such that the first layer of film over the first substrate surface is thicker than the first layer of film deposited over the second substrate surface; purging any unreacted second reactive gas; delivering the third reactive gas to the first and second substrate surfaces to etch the first layer of film over the first and second substrate surfaces, wherein the first layer of film over the second substrate surface is at least substantially removed, but the first layer of film over the first substrate is only partially removed; and purging any unreacted third reactive gas. If the etch process requires two precursors/reagents (such as in an atomic layer etching process), then a fourth gas outlet to deliver a fourth reactive gas may be included.

Figure 5:
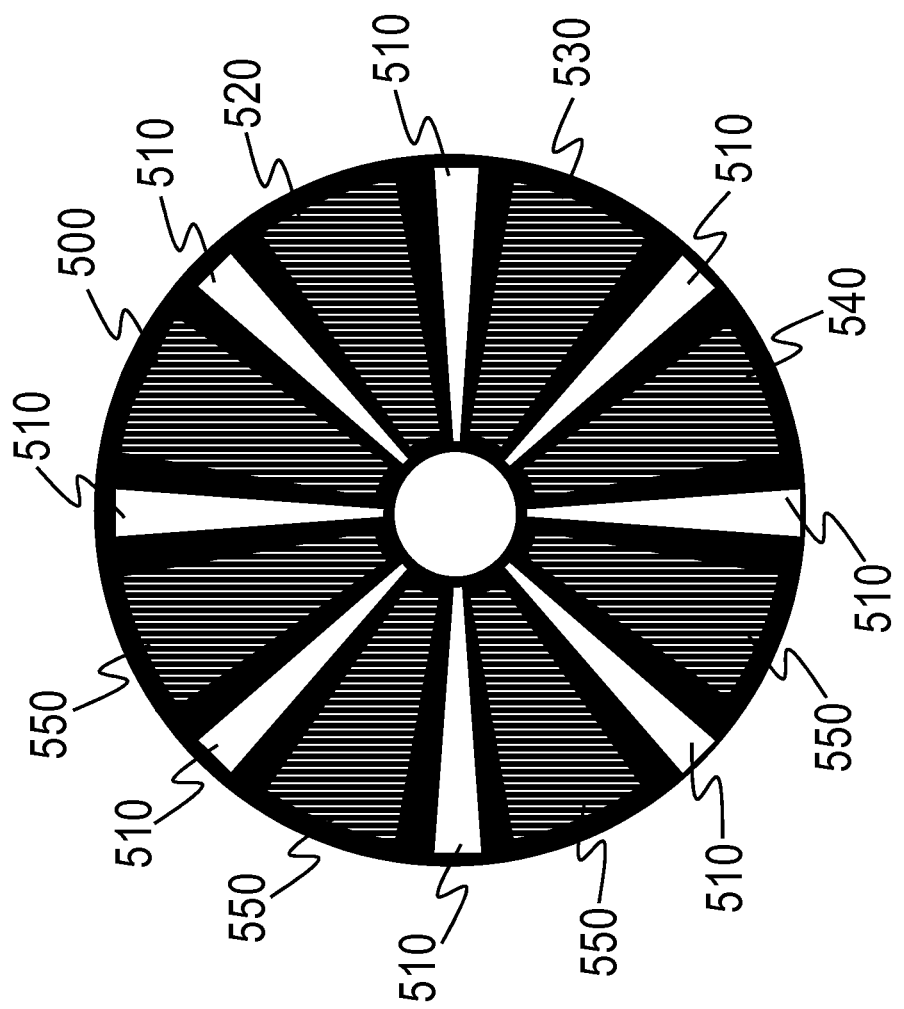
FIG. 5 shows a processing chamber in accordance with one or more embodiments of the disclosure.

FIG. 5 shows an exemplary process taking place in a spatially separated carousel setting. A substrate may be placed under a first sector 500, where it is exposed to a first precursor or reactant via an injector port. The first sector 500 may also be referred to as a first process region. In a process to deposit cobalt, an example of a suitable precursor is $Co(TMSA)_2$. The substrate is rotated or moved laterally through gas curtain 510 to a second sector 520. The gas curtain of some embodiments includes one or more of a purge gas and/or vacuum port. For example, an exemplary gas curtain comprises a combination of a purge gas port, followed by a vacuum port, followed by a second purge gas port. In some embodiments, each of the individual processing regions or sectors are separated from adjacent processing regions (or sectors) by a gas curtain. In some embodiments, some adjacent processing regions (or sectors) are separated by a gas curtain and some are not. For example, two adjacent processing regions may have the same process conditions (i.e., reactive gases, pressures, temperatures, etc) without a gas curtain in between. This effectively doubles the size of the processing region.

In the second sector 520, or second process region, the substrate is exposed to additional precursors or reactants via another injector port. In some embodiments, a co-reactant for the deposition of cobalt with $Co(TMSA)_2$ may include $NH_3$. In one or more embodiments, different portions of the substrate are exposed to both the first sector 500 and second sector 520 at the same time. For example, during the lateral movement of the substrate from the first sector 510 to the second sector 520, a first portion of the substrate is exposed to the gases in the first sector 500, a middle portion of the substrate is exposed to the gas curtain, and a second portion of the substrate is exposed to the second sector 520 at the same time.

The substrate may then be rotated, or laterally moved, under another gas curtain 510 and into a third sector 530. As used herein, the phrase "moved under" means that the substrate is moved adjacent to a gas injector, or through a gas injector region (including a gas curtain). It should not be taken as limiting the physical relationship of the substrate with the gas injector. The third sector 530 may contain reagents for etch processes. For example, $Br_2$ may be flowed onto the substrate via an injection port to halogenate the cobalt film prior to atomic layer etching of the film. The substrate may then pass under, or through, yet another gas curtain 510 and into a fourth sector 540, where the substrate may be exposed to another reactant. For example, after a substrate comprising cobalt has been halogenated, TMEDA may be flowed, which will chelate cobalt atoms from the surface to form cobalt complexes. Then the substrate may be moved through yet another gas curtain 510, where the chelated complex may then be purged from the surface. The substrate may be moved under additional sectors 550 and gas curtains 510 for additional processing. As a result, all of the deposition/etch chemistries are separated spatially from each other and unwanted side reactions are greatly reduced, if not eliminated. The substrate surfaces may then be brought back to the deposition sector 500 for further deposition and/or repeating the process. In some embodiments, the substrate may be large enough that it is exposed to more than one sector and/or gas curtain at a time. At some point during each lateral movement of the substrate from one sector to an adjacent sector, portions of the substrate are exposed to both sectors and a gas curtain separated the sectors, at the same time. It is to be understood that any individual part of the substrate in this case is exposed to one sector at a time, and the reactants/precursors are separated spatially for any given point on the substrate. There may be additional sectors and/or zones for other processes (e.g., anneal, UV exposure, e-beam, non-UV wavelength exposure (e.g., visible, IR, EUV, X-ray, etc.) and plasma exposure). Such processing may allow for modification and/or enhancement of film properties.

The processes described herein are distinct from previously known epitaxial deposition processes. One major drawback of the epitaxial technique is the necessity for chemical compatibility between the deposition gasses and the etch gasses. As the reactants are co-flowed, gas phase reactions may occur, which are generally not desired. Therefore, materials that do not react with each other must be chosen, which severely limits the possibilities of what epitaxial processes may be carried out. Furthermore, throughput concerns limit the ability to deliver separated pulses of deposition and etch gasses, due to the long times required to purge the chamber of each chemistry. This problem is exacerbated for more complex systems, which for example require multiple deposition gasses or etch gasses as more possibilities for interaction exist. For these reasons, the deposition techniques used in selective epitaxy deposition techniques have not been successfully extended to the deposition of other materials. Accordingly, in one or more embodiments, the processes described herein are not selective epitaxial processes. That is, the deposited films are not epitaxial films.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

EXAMPLE

Prophetic Example

Selective Deposition of Cobalt

A multi-material substrate is provided. Part of the substrate surface is a metal surface comprising tantalum, and another part is a dielectric comprising $SiO_2$. Both substrate surfaces are exposed to alternate flows of a $(TMSA)_2Co$ (THF) precursor and $NH_3$ co-reactant in ALD mode, with purge pulses in between precursor/reactant pulses. The substrate surface temperature was held at 200° C. The substrate is exposed to 7 cycles which results in 10.5 Angstroms of cobalt film deposition onto the metal surface, with only some spots of nucleation on the dielectric.

The substrate is exposed to a purge. Then, the cobalt film on the substrate is exposed to a $Br_2$ pulse at a temperatures of about 250. The substrate surface is then exposed to a pulse of N,N,N',N'-tetramethylethylenediamine (TMEDA) at a temperature of about 250° C. The TMEDA chelates with the cobalt in the deposited film. The TMEDA molecules coordinated to the cobalt atoms. The substrate is exposed to a purge gas, and the TMEDA is flowed away from the substrate. The substrate is exposed to one cycle, which results in 7 Angstroms of cobalt film removal over the metal substrate surface, and complete removal of the nucleation spots from the dielectric substrate surface. The net effect is 3.5 Angstroms of cobalt film deposition over the metal substrate surface only.

The above process is repeated ten times, resulting in 35 Angstroms of cobalt film over the metal substrate surface.

What is claimed is:

1. A method of selective layer deposition, the method comprising:
   providing a substrate comprising a first substrate surface and a second substrate surface;
   depositing a first layer of film over the first and second substrate surfaces, wherein the deposition has an incubation delay over the second substrate surface such that the first layer of film over the first substrate surface is thicker than the first layer of film deposited over the second substrate surface; and then
   etching the first layer of film over the first and second substrate surfaces, wherein the first layer of film over the second substrate surface is at least substantially removed, but the first layer of film over the first substrate surface is only partially removed,
   wherein the first substrate surface comprises a dielectric, and the second substrate surface comprise a metal.

2. The method of claim 1, wherein etching the first layer of film over the first and second substrate surfaces comprises etching away a thickness of the film equivalent to the thickness of the first layer of film over the second substrate surface.

3. The method of claim 1, wherein the first layer of film consists essentially of one or more metals.

4. The method of claim 3, wherein the metal is selected from the group consisting of tungsten and cobalt.

5. The method of claim 1, wherein depositing the first layer of film over the first and second substrate surfaces comprises atomic layer deposition or chemical vapor deposition.

6. The method of claim 5, wherein atomic layer deposition of the first layer of film comprises alternately exposing the first and second substrate surfaces to a tungsten precursor and hydrogen.

7. The method of claim 5, wherein atomic layer deposition of the first layer of film comprises alternately exposing the first and second substrate surfaces to a cobalt precursor and ammonia.

8. The method of claim 1, wherein etching the first layer of film over the first and second substrate surfaces comprises atomic layer etching or chemical etch.

9. The method of claim 8, wherein etching the first layer of film over the first and second substrate surfaces comprises atomic layer etching.

10. The method of claim 9, wherein atomic layer etching comprises alternately exposing the first layer of film over the first and second substrate surfaces to $Br_2$ and N,N,N',N'-tetramethylethylene diamine (TMEDA).

11. The method of claim 5, wherein the atomic layer deposition comprises a spatial atomic layer deposition process.

12. The method of claim 1, wherein depositing the first layer of film over the first and second substrate surfaces comprises atomic layer deposition, and etching the first layer of film over the first and second substrate surfaces comprises atomic layer etching.

13. The method of claim 1, further comprising depositing a second layer of film over the first layer of film.

14. The method of claim 1, further comprising
    depositing a first layer of a second film over the first and second substrate surfaces, wherein the deposition has an incubation delay over the first substrate surface and/or the first layer of the first film such that the first layer of the second film over the second substrate surface is thicker than the first layer of the second film deposited over the first substrate surface; and
    etching the first layer of the second film over the first and second substrate surfaces, wherein the first layer of the second film over the first substrate surface is at least substantially removed, but the first layer of the second film over the second substrate is only partially removed.

15. A method of selective atomic layer deposition of cobalt, the method comprising:
    providing a substrate having a first substrate surface comprising cobalt and a second substrate surface comprising a dielectric;
    exposing the first and second substrate surface to a precursor comprising Co(bis(trimethylsilyl) amido)$_2$ (tetrahydrofuran) to provide a first layer consisting essentially of cobalt over the first and second substrate surfaces, wherein the first layer consisting essentially of cobalt has a greater thickness over the first substrate surface than the second substrate surface; and
    exposing the first layer consisting essentially of cobalt over the first and second substrate surfaces to a compound having a structure represented by formula (I):

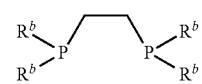

wherein each $R^b$ is independently hydrogen or C1-C4 alkyl.

16. The method of claim 15, further comprising halogenating the first layer consisting essentially of cobalt prior to exposing the first layer of cobalt to the compound of formula (I).

17. The method of claim 15, wherein the compound having a structure represented by formula (I) chelates with cobalt atoms in the first layer consisting essentially of cobalt until the layer of cobalt is substantially removed from the second substrate surface.

18. A method of processing a substrate comprising:
laterally moving a substrate having a first substrate surface and second substrate surface beneath a gas distribution plate comprising a plurality of elongate gas ports including a first gas outlet to deliver a first reactive gas, a second gas outlet to deliver a second reactive gas and a third gas outlet to deliver a third reactive gas;
delivering the first reactive gas comprising Co(bis(trimethylsilyl) amido)$_2$(tetrahydrofuran) to the first and second substrate surfaces to form a first reactive layer on the first and second substrate surfaces;
laterally moving the substrate from a first processing region adjacent the first gas outlet to a second processing region adjacent the second gas outlet;
delivering the second reactive gas comprising ammonia to the first and second substrate surfaces to react with the first reactive layer to form a first layer of film over the first and second substrate surfaces, wherein the deposition has an incubation delay over the second substrate surface such that the first layer of film over the first substrate surface is thicker than the first layer of film deposited over the second substrate surface;
laterally moving the substrate from the second processing region to a third processing region adjacent the third gas outlet; and
delivering the third reactive gas comprising TMEDA to the first and second substrate surfaces to etch the first layer of film over the first and second substrate surfaces, wherein the first layer of film over the second substrate surface is at least substantially removed, but the first layer of film over the first substrate is only partially removed.

\* \* \* \* \*

UNITED STATES PATENT AND TRADEMARK OFFICE
CERTIFICATE OF CORRECTION

PATENT NO. : 9,716,012 B2
APPLICATION NO. : 14/560525
DATED : July 25, 2017
INVENTOR(S) : Thompson et al.

It is certified that error appears in the above-identified patent and that said Letters Patent is hereby corrected as shown below:

In the Specification

In Column 11, Lines 22-23, delete "2-[dialkylamino)" and insert -- 2-[(dialkylamino) --, therefor.

Signed and Sealed this
Third Day of October, 2017

Joseph Matal
*Performing the Functions and Duties of the*
*Under Secretary of Commerce for Intellectual Property and*
*Director of the United States Patent and Trademark Office*